(12) United States Patent
Rivolta et al.

(10) Patent No.: US 12,164,357 B2
(45) Date of Patent: *Dec. 10, 2024

(54) BAG DETECTION USING AN ELECTROSTATIC CHARGE SENSOR

(71) Applicant: STMICROELECTRONICS S.r.l., Agrate Brianza (IT)

(72) Inventors: Stefano Paolo Rivolta, Desio (IT); Roberto Mura, Milan (IT); Marco Bianco, Cesano Boscone (IT)

(73) Assignee: STMICROELECTRONICS S.r.l., Agrate Brianza (IT)

( * ) Notice: Subject to any disclaimer, the term of this patent is extended or adjusted under 35 U.S.C. 154(b) by 0 days.

This patent is subject to a terminal disclaimer.

(21) Appl. No.: 18/356,963

(22) Filed: Jul. 21, 2023

(65) Prior Publication Data

US 2023/0359262 A1 Nov. 9, 2023

Related U.S. Application Data

(63) Continuation of application No. 17/379,743, filed on Jul. 19, 2021, now Pat. No. 11,755,095.

(51) Int. Cl.
*G06F 1/32* (2019.01)
*G01P 15/14* (2013.01)
*G01R 29/12* (2006.01)
*G06F 1/3231* (2019.01)

(52) U.S. Cl.
CPC ............ *G06F 1/3231* (2013.01); *G01P 15/14* (2013.01); *G01R 29/12* (2013.01)

(58) Field of Classification Search
CPC ........................................................ G06F 1/32
See application file for complete search history.

(56) References Cited

U.S. PATENT DOCUMENTS

| 9,788,277 | B2 | 10/2017 | Ting et al. |
| 10,324,214 | B2 | 6/2019 | Aponte Luis |
| 10,477,354 | B2 | 11/2019 | Patel et al. |
| 11,755,095 | B2 * | 9/2023 | Rivolta .................. G06F 1/1684 |
| | | | 713/323 |

(Continued)

FOREIGN PATENT DOCUMENTS

| EP | 2980609 A1 | 2/2016 |
| KR | 1020110061750 A | 6/2011 |

OTHER PUBLICATIONS

Stefano Paolo Rivolta et al., "Electronic Device Including Bag Detection," U.S. Appl. No. 17/144,016, filed Jan. 7, 2021, 39 pages.

(Continued)

*Primary Examiner* — Paul B Yanchus, III
(74) *Attorney, Agent, or Firm* — SEED IP LAW GROUP LLP

(57) ABSTRACT

The present disclosure is directed to a device configured to detect whether the device is in a bag or being taken out of the bag. The device determines whether the device is in a bag or being taken out of the bag based on motion measurements generated by a motion sensor and electrostatic charge measurements generated by an electrostatic charge sensor. By using both distance measurements and motion measurements, the device is able to detect whether the device is in the bag or being taken out of the bag with high efficiency, accuracy, and robustness.

19 Claims, 8 Drawing Sheets

(56) References Cited

U.S. PATENT DOCUMENTS

| | | |
|---|---|---|
| 2003/0197597 A1 | 10/2003 | Bahl et al. |
| 2012/0206414 A1 | 8/2012 | Tada et al. |
| 2014/0232516 A1 | 8/2014 | Stivoric et al. |
| 2015/0346907 A1 | 12/2015 | Nakajima et al. |
| 2015/0355370 A1 | 12/2015 | Kobayashi et al. |
| 2016/0342781 A1 | 11/2016 | Jeon |
| 2018/0269954 A1 | 9/2018 | Raghavan et al. |
| 2019/0227188 A1 | 7/2019 | Aponte Luis |
| 2019/0393944 A1 | 12/2019 | Huang et al. |
| 2020/0326767 A1 | 10/2020 | Iyer et al. |
| 2021/0081032 A1 | 3/2021 | Passaniti et al. |
| 2022/0100252 A1 | 3/2022 | Polat et al. |
| 2023/0023149 A1 | 1/2023 | Rivolta et al. |

OTHER PUBLICATIONS

Stefano Paolo Rivolta et al., "Method and System for Managing Power States Transitions of a Portable Electronic Device, and Portable Electronic Device," U.S. Appl. No. 17/168,110, filed Feb. 4, 2021, 60 pages.

* cited by examiner

BAG DETECTION USING AN ELECTROSTATIC CHARGE SENSOR

BACKGROUND

Technical Field

The present disclosure is directed to a system and method for detecting whether an electronic device is in a bag or is being taken out of a bag.

Description of the Related Art

Many electronic devices support a comprehensive and system-wide set of power management features to improve user experience, extend battery duration, save energy, and reduce heat and noise of the device. Power management features are particularly important for portable devices, such as laptop computers, tablets, and mobile devices, due to their limited power supply.

Power management features typically include options to transition the device between several different power states. For example, many devices support intermediate power states that are between an off state (e.g., the device is completely shut down and consumes no power) and an on state (e.g., the device is powered on and ready to be used by a user). Intermediate power states may include a sleep state in which the device is in a reduced power, idle state; and a hibernate state that is similar to the sleep state but consumes even less power. Intermediate power states allow a device to quickly return to an on state when the device is ready to be used by a user.

Many devices utilize device context recognition to customize transitions between power states. A device context algorithm may detect several different activities, such as whether a device is stationary, being held by a user that's walking or running, or another type of activity. One of the simplest implementations of a device context recognition algorithm is based on motion sensors, such as accelerometers and gyroscopes.

Based on a detected activity, a device may transition between power states. For example, a laptop computer may switch from an on state to a sleep state in response to detecting that the laptop computer is being held by a user that is walking or running, and switch from a hibernate or sleep state to an on state in response to detecting that the laptop computer is stationary.

BRIEF SUMMARY

The present disclosure is directed to a device that detects whether the device is in a bag (e.g., a briefcase, backpack, and shoulder bag) or is being taken out of the bag. The device determines whether the device is in a bag or is being taken out of the bag based on motion measurements generated by a motion sensor and electrostatic charge measurements generated by an electrostatic charge sensor. By using both motion measurements and electrostatic charge measurements, the device is able to detect whether the device is in a bag or is being taken out of the bag with high efficiency, accuracy, and robustness.

A power state of the device is adjusted based on whether the device is in or outside of a bag. For example, the device may be set to an off or low power state in response to detecting that the device is in a bag, and set to an on power state in response to detecting that the device is being taken out of the bag.

BRIEF DESCRIPTION OF THE SEVERAL VIEWS OF THE DRAWINGS

In the drawings, identical reference numbers identify similar features or elements. The size and relative positions of features in the drawings are not necessarily drawn to scale.

DETAILED DESCRIPTION

Figure 1A:
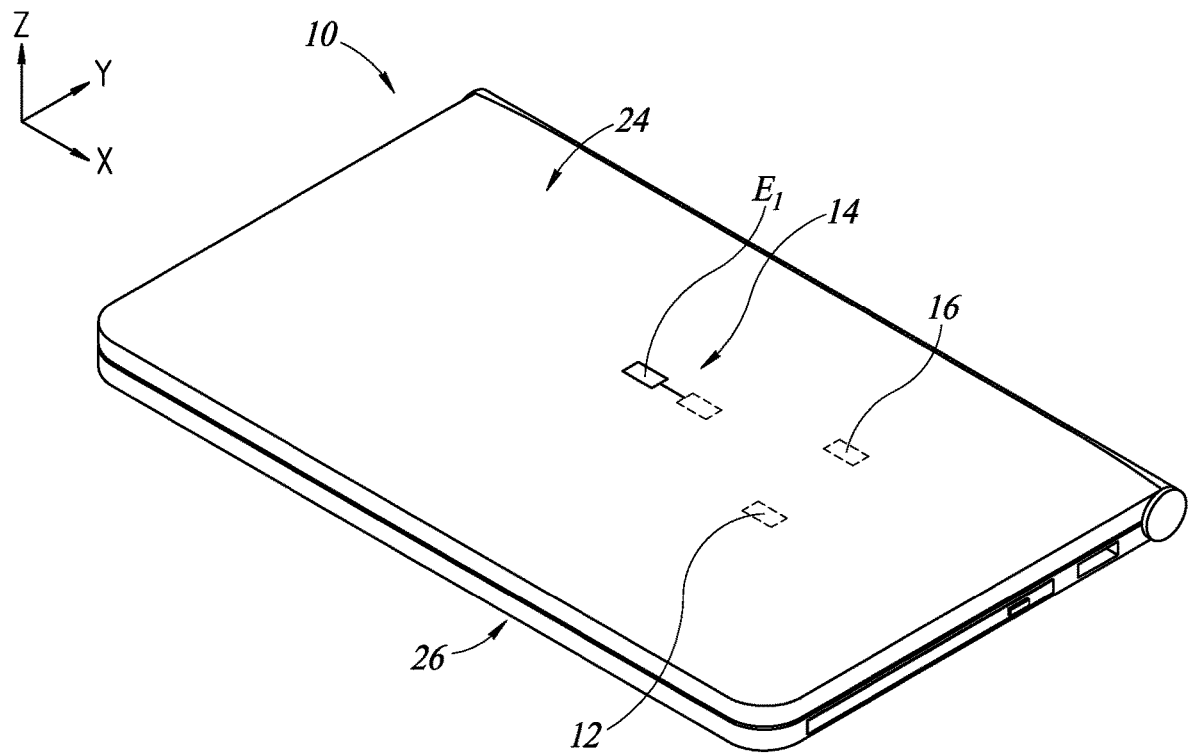
FIG. 1A is a first angled, perspective view of a device according to an embodiment disclosed herein.

In the following description, certain specific details are set forth in order to provide a thorough understanding of various aspects of the disclosed subject matter. However, the disclosed subject matter may be practiced without these specific details. In some instances, well-known machine learning techniques, power states, and structures and methods of manufacturing electronic devices and sensors have not been described in detail to avoid obscuring the descriptions of other aspects of the present disclosure.

Unless the context requires otherwise, throughout the specification and claims that follow, the word "comprise" and variations thereof, such as "comprises" and "comprising," are to be construed in an open, inclusive sense, that is, as "including, but not limited to."

Reference throughout the specification to "one embodiment" or "an embodiment" means that a particular feature, structure, or characteristic described in connection with the embodiment is included in at least one embodiment. Thus, the appearance of the phrases "in one embodiment" or "in an embodiment" in various places throughout the specification are not necessarily all referring to the same aspect. Furthermore, the particular features, structures, or characteristics may be combined in any suitable manner in one or more aspects of the present disclosure.

As discussed above, many devices allow a manufacturer or user to customize transitions between power states of the device using device context recognition. For example, a laptop computer may switch from an on state to a hibernate or sleep state in response to detecting that the laptop computer is being held by a user that is walking or running, and switch from a hibernate state to an on state in response to detecting that the laptop computer is stationary.

It is desirable for device manufacturers to allow further customization of power state transitions by detecting additional activities or events for triggering the power state transitions. Activities that do not require direct interaction from the user are particularly desirable because the device does not have to rely on a user's action (e.g., pressing a power button, opening a laptop computer, closing a laptop computer, etc.). Rather, the device may preemptively trigger a power state transition for the user. As a result, user experience, battery duration, energy conservation, and heat and noise of a device may be improved further.

Some devices include in-bag detection, which detects whether the device is placed in a bag (e.g., a briefcase, backpack, and shoulder bag), and out-from-bag detection, which detects whether the device is being taken out of a bag. Typically, the device is set to a hibernate state in response to detecting that the device is inside of a bag to reduce or prevent overheating of the device; and is set to an on state in response to detecting that the device is being taken out of a bag to allow the operating system to wake up rapidly or preemptively. However, current in-bag and out-from-bag detection methods entail large amounts of processing and are time consuming. Further, current in-bag and out-from-bag detection methods often result in false detections.

The present disclosure is directed to a device with improved in-bag and out-from-bag detection. The bag may be a briefcase, backpack, shoulder bag, or any other type of container that holds the device. The device utilizes one or more motion sensors and an electrostatic charge sensor to detect whether the device is in a bag or is being taken out of the bag. Using the electrostatic charge sensor in combination with the one or more motion sensors improves processing time for in-bag detection, and reduces false detections for out-from-bag detection. The device subsequently transitions between power states based on detecting whether the device is in or out of the bag.

Figure 1B:
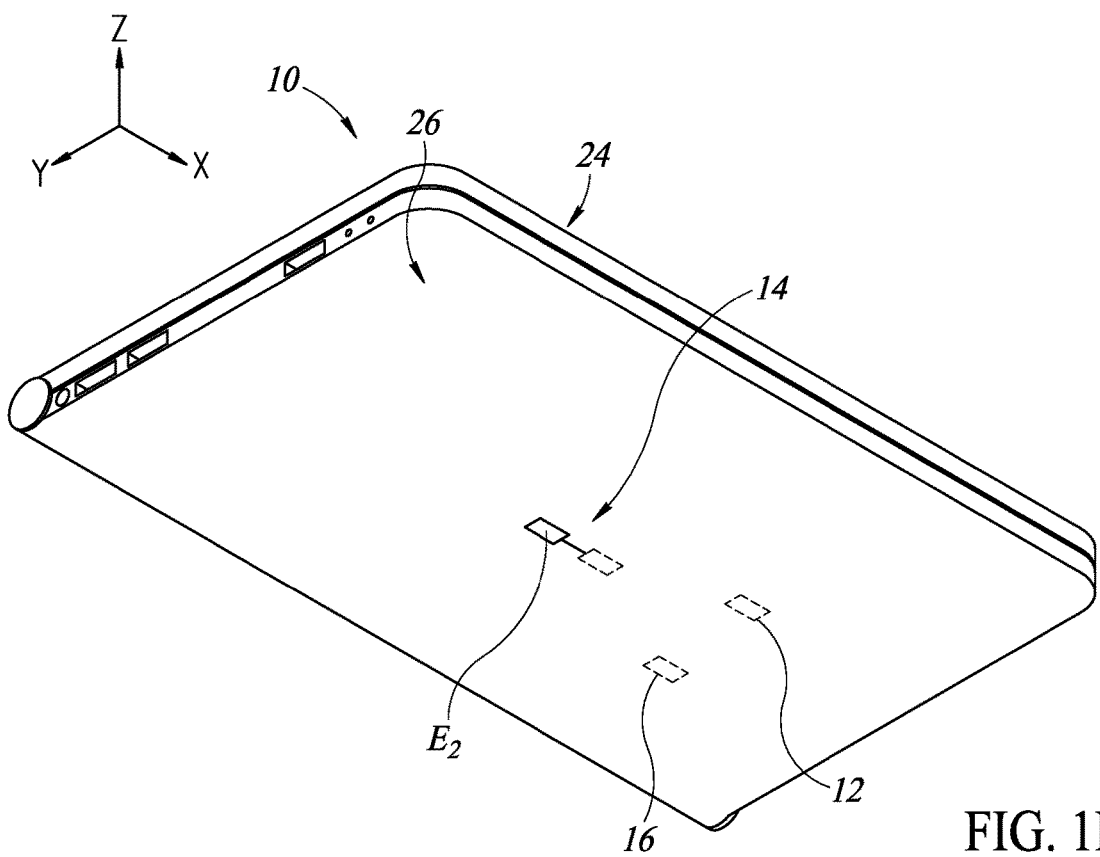
FIG. 1B is a second angled, perspective view of the device of FIG. 1A according to an embodiment disclosed herein.

FIG. 1A is a first angled, perspective view of a device 10 according to an embodiment disclosed herein. FIG. 1B is a second angled, perspective view of the device 10 according to an embodiment disclosed herein. A length of the device 10 extends along an x axis, a width of the device 10 extends along a y axis, and a height of the device 10 extends along a z axis. It is beneficial to review FIGS. 1A and 1B together.

The device 10 is an electronic device that is configured to detect whether the device 10 is in a bag or is being taken out of the bag. In the embodiment shown in FIGS. 1A and 1B, the device 10 is a laptop computer. However, the device 10 may be any type of electronic device that may be stored or carried in a bag. For example, the device 10 may be a laptop computer, a tablet, a cellular phone, or any type of mobile device. The device 10 includes a motion sensor 12, an electrostatic charge sensor 14, and a sensor controller 16.

The motion sensor 12 is configured to measure a motion of the device 10, and generates a motion measurement that indicates the measured motion. In one embodiment, the motion measurement is in the form of an electrical signal (e.g., voltage or current signal) that is proportional to the measured motion.

The motion sensor 12 may be an accelerometer that measures acceleration along at least one axis. Alternatively, the accelerometer measures acceleration along three axes (e.g., along the x, y, and z axes shown in FIGS. 1A and 1B).

The motion sensor 12 may also be a gyroscope that measures angular velocity along at least one axis or that measures angular velocity along three axes (e.g., along the x, y, and z axes shown in FIGS. 1A and 1B).

In one embodiment, the motion sensor 12 is a combination sensor that includes both an accelerometer and a gyroscope, where the motion sensor 12 measures both acceleration and angular velocity. Operation of the motion sensor 12 will be discussed in further detail below.

Although a single motion sensor 12 is shown in FIGS. 1A and 1B, the device 10 may include any number of motion sensors. For instance, the device 10 includes a first motion sensor that is an accelerometer, and a second motion sensor that is a gyroscope.

The electrostatic charge sensor 14 is configured to generate an electrostatic charge measurement that indicates the measured electrostatic charge. In one embodiment, the electrostatic charge measurement is in the form of an electrical signal (e.g., voltage or current signal) that is proportional to the measured electrostatic charge.

In one embodiment, the electrostatic charge sensor 14 includes a single electrode and electrical components (e.g., resistors, capacitors, amplifiers, etc.) that measure the electrostatic charge detected by the single electrode.

Figure 2:
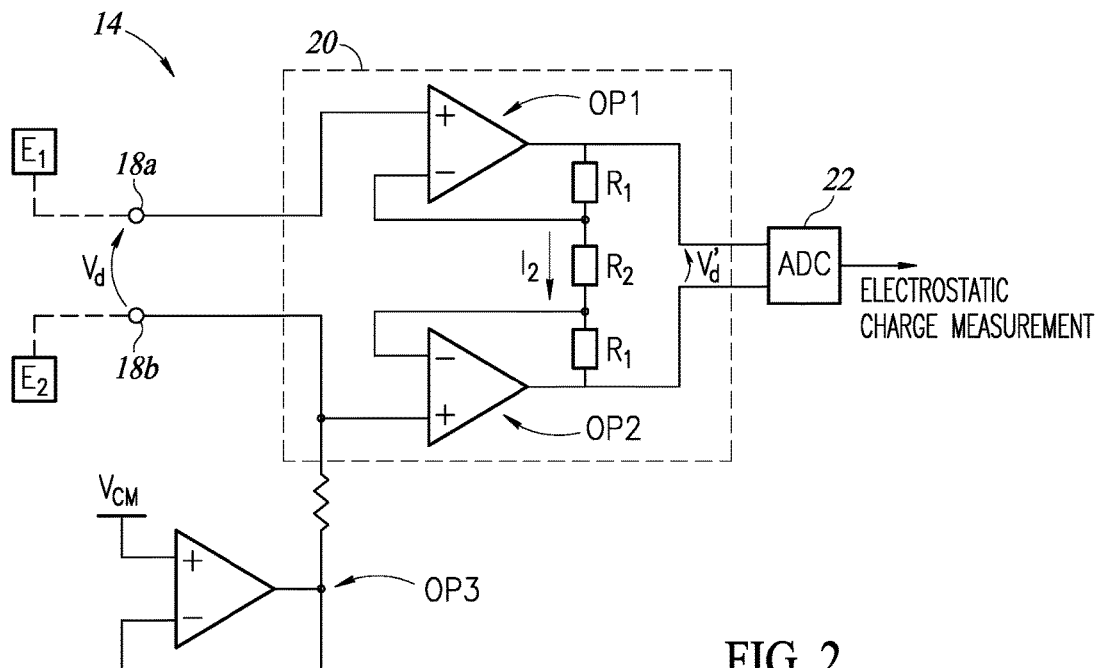
FIG. 2 is a diagram of an electric charge sensor according to an embodiment disclosed herein.

In one embodiment, the electrostatic charge sensor 14 includes two electrodes on two different surfaces of the device 10, and electrical components (e.g., resistors, capacitors, amplifiers, etc.) that measure the electrostatic charge detected between the two electrodes. FIG. 2 is a diagram of the electric charge sensor 14 according to an embodiment disclosed herein. The electrostatic charge sensor 14 includes a pair of input terminals 18a, 18b, coupled to input electrodes $E_1$, $E_2$, respectively.

Each of the electrodes $E_1$, $E_2$ is made of conductive material and, in one embodiment, coated with an insulating layer. The geometry of the electrodes $E_1$, $E_2$ determines the sensitivity and directivity of the electrostatic charge sensor 14. The sensitivity is proportional to the surface area of the electrodes $E_1$, $E_2$. The shape of the electrodes $E_1$, $E_2$ and their positioning in space affects the directivity of the electrostatic charge sensor 14. In one embodiment, the electrodes $E_1$, $E_2$ are square in shape, with sides equal to about 2-10 cm (e.g., 5 cm).

The electrodes $E_1$, $E_2$ are positioned on one or more exposed surfaces of the device 10 such that the electrodes $E_1$, $E_2$ are exposed to a surrounding environment. For example, as shown in FIGS. 1A and 1B, the electrode $E_1$ is positioned on an upper surface 24 of the device 10, and the electrode $E_2$ is positioned on a lower surface 26 of the device 10. The electrodes $E_1$, $E_2$ may be positioned on any surface of the device 10, such as side surfaces of the device 10.

The pair of input terminals 18a, 18b receive, from the respective electrodes $E_1$, $E_2$, an input voltage $V_d$ (a differential signal), and supplies the input voltage $V_d$ to an instrumentation amplifier 20. A presence of a bag generates a variation of electrostatic charge which, in turn, after having been detected by the electrodes $E_1$, $E_2$, generates the input voltage $V_d$.

The instrumentation amplifier 20 includes operational amplifiers OP1, OP2 and a biasing stage (buffer) OP3. The biasing stage OP3 biases the instrumentation amplifier 20 to a common mode voltage $V_{CM}$.

An inverting terminal of the amplifier OP1 is electrically connected to an inverting terminal of the amplifier OP2 through a resistor $R_2$ across which there is a voltage equal to the input voltage $V_d$. Therefore, a current equal to $I_2=V_d/R_2$ will flow through this resistor $R_2$. The current $I_2$ does not come from the input terminals of the operational amplifiers OP1, OP2, and, therefore, runs through two resistors $R_1$ connected between the outputs of the operational amplifiers OP1, OP2, in series with the resistor $R_2$. The current $I_2$, which runs through the series of the three resistors $R_1$-$R_2$-$R_1$, produces a differential output voltage $V_d'$, which is given by $V_d'=(2R_1+R_2)I_2=(2R_1+R_2)V_d/R_2$. The overall gain of the circuit of FIG. 2 is $Ad=V_d'/V_d=(2R_1+R_2)/R_2=1+2R_1/R_2$. The differential gain depends on the value of the resistor $R_2$ and may therefore be modified by acting on the resistor $R_2$.

The differential output voltage $V_d'$, therefore being proportional to the potential $V_d$ between the input terminals 18a, 18b, is input to an analog-to-digital converter (ADC) 22, which outputs a charge variation signal. The charge variation signal is, for example, a high-resolution digital stream (e.g., 16 bits or 24 bits). The charge variation signal is an electrostatic charge measurement of an electrostatic charge in a surrounding environment.

In another embodiment, the instrumentation amplifier 20 is omitted, so that the ADC 22 receives the differential output voltage $V_d$ between the electrodes $E_1$, $E_2$ and samples the differential output voltage $V_d$ directly. In another embodiment, the ADC 22 is omitted, and the charge variation signal is the differential output voltage $V_d$.

Although a single electrostatic charge sensor 14 is shown in FIGS. 1A and 1B, the device 10 may include any number of electrostatic charge sensors. For example, the device 10 may include first and second electrostatic charge sensors with two electrodes of the first electrostatic charge sensor on two different surfaces of the device 10 and two electrodes of the second electrostatic charge sensor on another two different surfaces of the device 10.

Returning to FIGS. 1A and 1B, the sensor controller 16 is communicatively coupled to the motion sensor 12 and the electrostatic charge sensor 14. The sensor controller 16 is configured to receive motion measurements from the motion sensor 12 and electrostatic charge measurements from the electrostatic charge sensor 14, and determine whether the device 10 is in a bag or is being taken out of the bag based on the motion measurements and electrostatic charge measurements. The sensor controller 16 is also configured to adjust a power state of the device 10. The sensor controller 16 may be a processor, controller, signal processor, or any other type of processing unit. Operation and the location of the sensor controller 16 within the device 10 will be discussed in further detail below.

Figure 3:
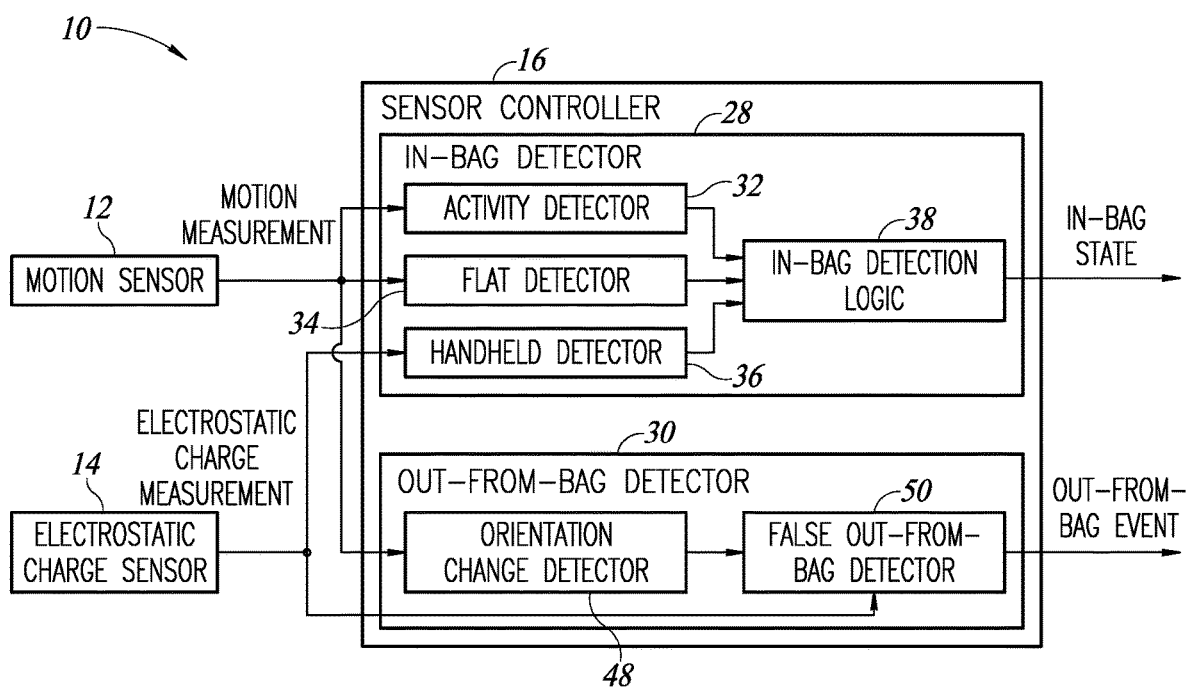
FIG. 3 is a block diagram of a device according to an embodiment disclosed herein.

FIG. 3 is a block diagram of the device 10 according to an embodiment disclosed herein. As discussed above, the device 10 includes the motion sensor 12, the electrostatic charge sensor 14, and the sensor controller 16. The motion sensor 12 generates motion measurements that indicate measured motions of the device 10, the electrostatic charge sensor 14 generates an electrostatic charge measurement that indicates measured electrostatic charges from the electrodes of the device 10, and the sensor controller 16 determines whether the device 10 is in a bag or being taken out of the bag based on the motion measurements and electrostatic charge measurements.

The sensor controller 16 includes an in-bag detector 28 and an out-from-bag detector 30. The in-bag detector 28 and the out-from-bag detector 30 may be implemented as algorithms or software modules executed by the sensor controller 16. Hardware solutions, such as dedicated circuitry configured to perform the functions of the in-bag detector 28 and the out-from-bag detector 30, are also possible.

The in-bag detector 28 is communicatively coupled to the motion sensor 12 and the electrostatic charge sensor 14. The in-bag detector 28 receives motion measurements from the motion sensor 12 and electrostatic charge measurements from the electrostatic charge sensor 14, and detects whether or not the device 10 is inside a bag based on the motion measurements and the electrostatic charge measurements. As noted above, the bag may be a briefcase, backpack, shoulder bag, or any other type of container that holds the device 10.

The in-bag detector 28 includes an activity detector 32, a flat detector 34, a handheld detector 36, and in-bag detection logic 38.

The activity detector 32 detects an activity state of the device 10. For example, the activity detector 32 detects whether or not the device 10 is in a steady state, a walking state, or a transport state. In the steady state, the device 10 is stationary and is not moving. In the walking state, the device 10 is being carried by a user that is walking or running. In the transport state, the device 10 is in transit by, for example, car, bike, train, bus, etc.

The activity detector 32 detects whether the device 10 is in the steady state, the walking state, or the transport state based on the motion measurements received from the motion sensor 12. As discussed above, the motion measurements may include acceleration measurements of the device 10, angular velocity measurements of the device 10, or a combination of acceleration and angular velocity measurements of the device 10. The activity detector 32 outputs the detected state to the in-bag detection logic 38.

In one embodiment, the activity detector 32 classifies the motion measurements as the steady state, the walking state, or the transport state using machine learning techniques, such as a decision tree, a neural network, and a support vector machine. For example, the activity detector 32 computes a set of features to match current motion measurements to motion measurements expected for one of a plurality of pre-defined classes of targeted activities of interest. Such an approach utilizes labeled training data for each of the activities desired to be recognized in order to generate the classifier. Moreover, deep neural network models may also be used and implemented for activity recognition. Deep neural network models are capable of performing automatic feature learning from the raw sensor data and out-perform models fit on hand-crafted domain-specific features. Statistical models (e.g., Markov models and/or the like) can also be used.

The flat detector 34 detects whether the device 10 is in a flat state or a non-flat state. In the flat state, a base of the device 10 (e.g., lower surface 26 of the device 10 as shown in FIG. 1B) is lying on a flat surface, such as a desk. In the non-flat state, the device 10 is not level. That is, the base of the device 10 is not lying on a flat surface.

The flat detector 34 detects whether the device 10 is in the flat state or the non-flat state based on the motion measurements received from the motion sensor 12. As discussed above, the motion measurements may include acceleration measurements of the device 10, angular velocity measurements of the device 10, or a combination of acceleration and angular velocity measurements of the device 10. The flat detector 34 outputs the detected state to the in-bag detection logic 38.

In one embodiment, the flat detector 34 detects the flat state and the non-flat state based on acceleration measurements along one or more axes. For example, referring to FIG. 1, the flat detector 34 detects the flat state in response to the motion sensor 12 measuring near zero accelerations (i.e., less than a first threshold value) along the x axis and the y axis, and measuring an acceleration parallel to a gravity vector (i.e., greater than a second threshold value) along the z axis. Conversely, the flat detector 34 detects the non-flat state in response to the motion sensor 12 measuring non-zero accelerations (i.e., greater than the first threshold value) along the x axis or the y axis, or measuring a near zero acceleration transverse to a gravity vector (i.e., less than the second threshold value) along the z axis.

The handheld detector 36 distinguishes between a scenario in which the device 10 is actually carried in a bag or is instead carried by a user with a position or orientation that replicates the position of the device 10 in the bag, without actually being in the bag (e.g., device 10 is carried under the user's arm with the lid closed). In particular, there might be that case where the user has to move from one location to another and carries the device 10 by hands for ease of transportation, without necessarily putting the device in the bag. In order to cope with this further scenario, the handheld detector 36 senses whether the device 10 is actually in a bag or is carried hand-held (e.g., under the user's arm or kept/hold by a hand, or held at the user's chest).

The handheld detector 36 detects whether the device 10 is in a handheld state or a non-handheld state. In the handheld state, the device 10 is being carried in a user's hand. In the non-handheld state, the device 10 is not carried in a user's hand and is instead being carried, for example, in a bag. In one embodiment, the handheld detector 36 detects the non-handheld state in a case where the activity detector 32 detects the walking state. The handheld detector 36 outputs the detected state to the in-bag detection logic 38.

The handheld detector 36 detects whether the device 10 is in the handheld state or the non-handheld state based on the electrostatic charge measurements from the electrostatic charge sensor 14. As discussed above, the electrostatic charge measurements indicate measured electrostatic charges between the electrodes of the device 10.

When the device 10 is inside a bag, electrostatic charge measurements are strongly amplified during motion compared to when the device 10 is carried in a user's hand. For example, FIG. 4A is an electrostatic charge measurement signal 40 in a case where the electrostatic charge sensor 14 includes a single electrode and the device 10 is inside a bag, and FIG. 4B is an electrostatic charge measurement signal 42 in a case where the electrostatic charge sensor 14 includes a single electrode and the device 10 is carried in a user's hand.

Figure 4A:
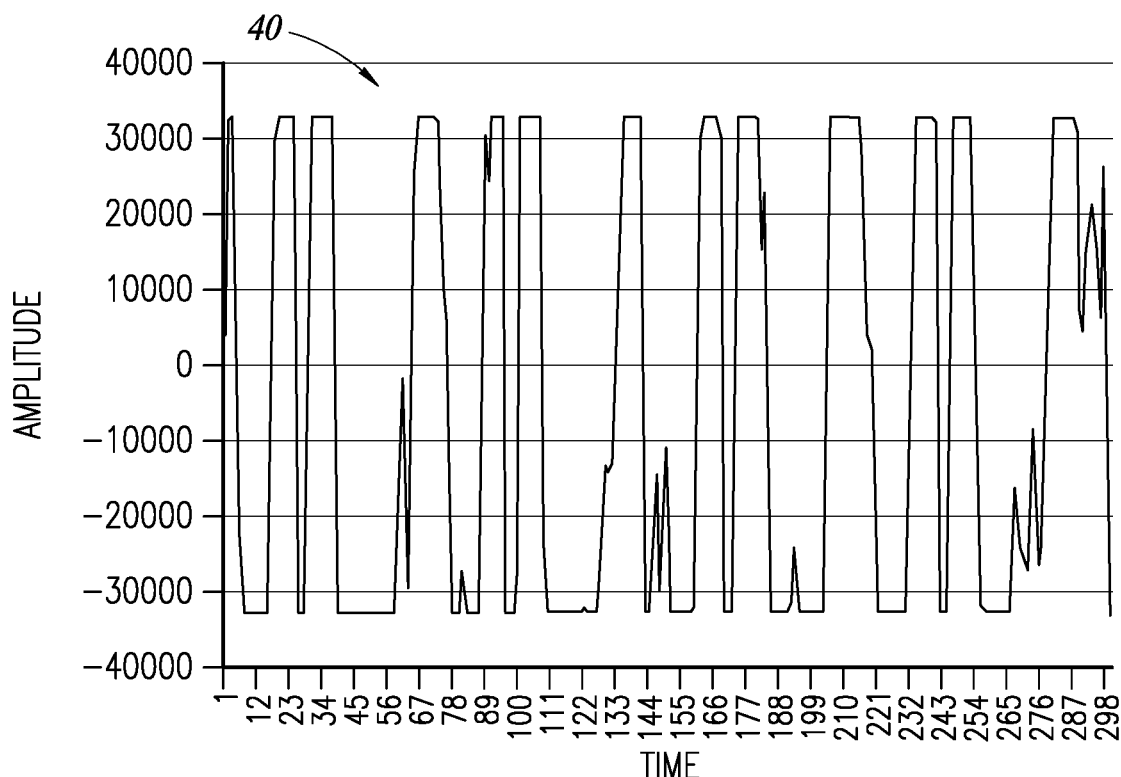
FIG. 4A is an electrostatic charge measurement signal in a case where an electrostatic charge sensor includes a single electrode and a device is inside a bag according to an embodiment disclosed herein.
Figure 4B:
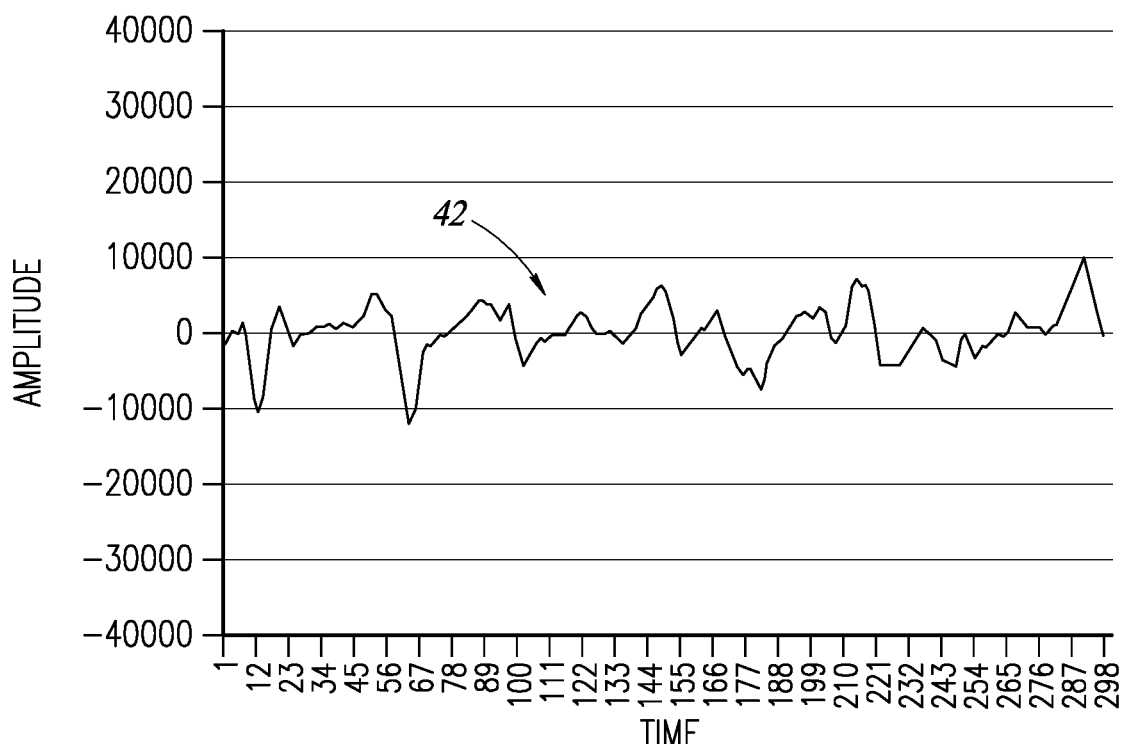
FIG. 4B is an electrostatic charge measurement signal in a case where an electrostatic charge sensor includes a single electrode and a device is carried in a user's hand according to an embodiment disclosed herein.

In FIGS. 4A and 4B, the vertical axes are amplitudes of the electrostatic charge measurement signals, and the horizontal axes are time axes. The amplitudes are outputs from an analog-to-digital converter (ADC) with a full scale value (i.e., absolute maximum value) of 32,000, and the time axes are samples of the electrostatic charge measurements signals taken at 60 hertz for 5 seconds. Other amplitude and time units are also possible.

Comparing the electrostatic charge measurement signal 40 to the electrostatic charge measurement signal 42, it can be seen that the electrostatic charge measurement signal 40 includes larger amplitude values and has greater variance. This is due to the large amounts of electrostatic charge being generated inside the bag when the device 10 is in motion. For example, large amounts of electrostatic charge is generated from the bag being rubbed against inner surfaces of the bag.

Figure 5A:
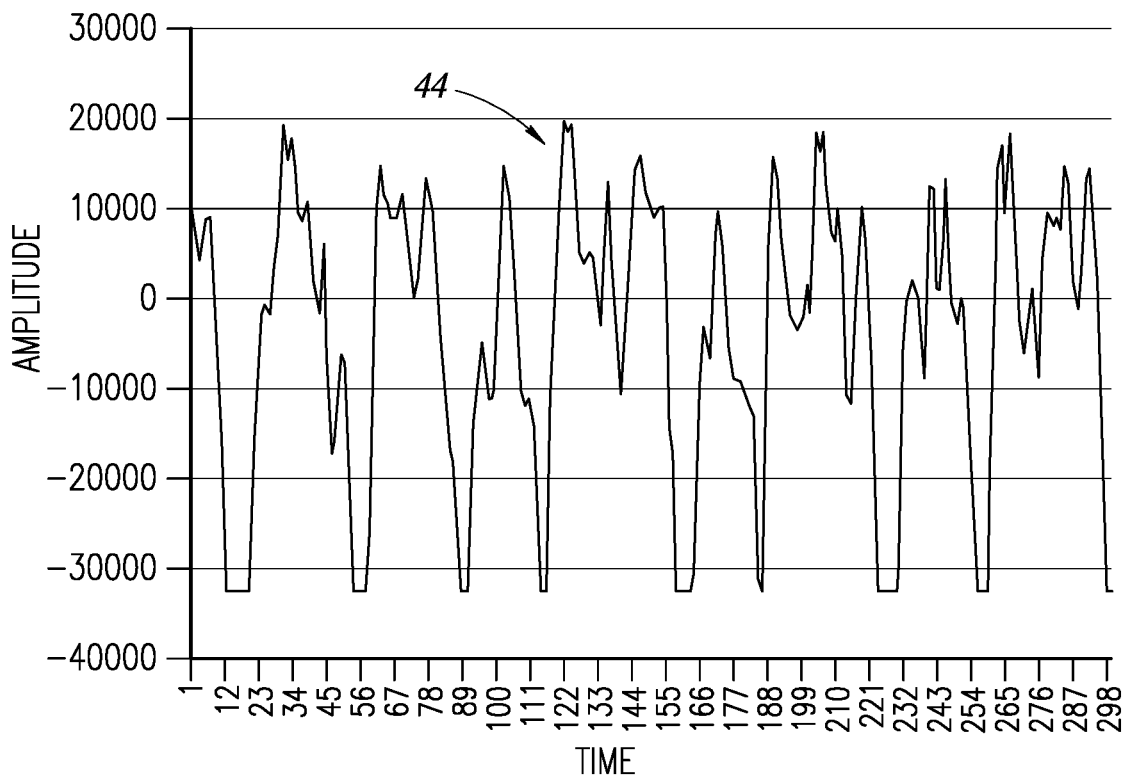
FIG. 5A is an electrostatic charge measurement signal in a case where an electrostatic charge sensor includes two electrodes and a device is inside a bag according to an embodiment disclosed herein.
Figure 5B:
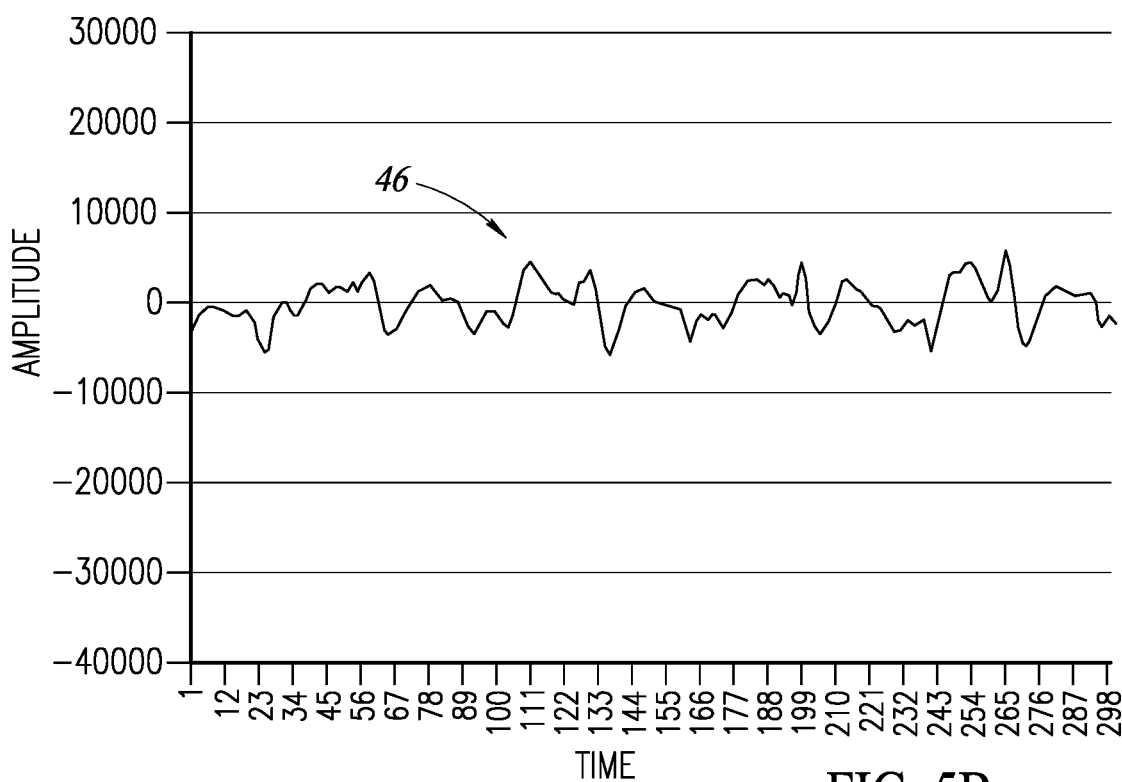
FIG. 5B is an electrostatic charge measurement signal in a case where an electrostatic charge sensor includes two electrodes and a device is carried in a user's hand according to an embodiment disclosed herein.

As another example, FIG. 5A is an electrostatic charge measurement signal 44 in a case where the electrostatic charge sensor 14 includes two electrodes and the device 10 is inside a bag, and FIG. 5B is an electrostatic charge measurement signal 46 in a case where the electrostatic charge sensor 14 includes two electrodes and the device 10 is carried in a user's hand.

Similar to FIGS. 4A and 4B, in the examples shown in FIGS. 5A and 5B, the amplitudes are outputs from an ADC with a full scale value of 32,000, and the time axes are samples of the electrostatic charge measurements signals taken at 60 hertz for 5 seconds.

Comparing the electrostatic charge measurement signal 44 to the electrostatic charge measurement signal 46, it can be seen that the electrostatic charge measurement signal 44 includes larger amplitude values and has greater variance.

Accordingly, the handheld detector 36 is able to determine whether the device 10 is in the handheld state or the non-handheld state by determining whether or not electrostatic charge measurements generated by the electrostatic charge sensor 14 are strongly amplified.

In one embodiment, the handheld detector 36 determines whether or not an electrostatic charge measurement signal generated by the electrostatic charge sensor 14 is greater than or equal to a threshold value for a threshold number of times during a set period of time. In response to the handheld detector 36 determining that the electrostatic charge measurement signal is greater than or equal to the threshold value for the threshold number of times, the handheld detector 36 determines that the device 10 is in the non-handheld state. Conversely, in response to the handheld detector 36 determining that the electrostatic charge measurement signal is not greater than or equal to the threshold value (i.e., less than the threshold value) for the threshold number of times, the handheld detector 36 determines that the device 10 is in the handheld state.

In one embodiment, the handheld detector 36 determines whether or not a variance of an electrostatic charge measurement signal generated by the electrostatic charge sensor 14 is greater than or equal to a threshold value for a set period of time. In response to the handheld detector 36 determining that the variance is greater than or equal to the threshold value, the handheld detector 36 determines that the device 10 is in the non-handheld state. In response to the handheld detector 36 determining that the variance is not greater than or equal to the threshold value (i.e., less than the threshold value), the handheld detector 36 determines that the device 10 is in the handheld state.

Returning to FIG. 3, the in-bag detection logic 38 receives the detected states from the activity detector 32, the flat detector 34, and the handheld detector 36; and determines whether or not the device 10 is in the in-bag state based on the detected states. In the in-bag state, the device 10 is estimated to be inside a bag.

In one embodiment, the in-bag detection logic 38 determines the device 10 is in the in-bag state in a case where the device 10 is in the steady state and the non-flat state, or is in the walking state and in the non-handheld state, or is in the transport state. Stated differently, the in-bag detection logic 38 determines the device 10 is in the in-bag state in a case where the following equation is met:

(Steady State=True AND Non-Flat State=True) OR (Walking State=True AND Non-Handheld State=True) OR (Transport State=True)

In case the device 10 includes two surfaces (e.g., a laptop with a screen and a keyboard, or foldable device) the in-bag state is evaluated when the device 10 is in a lid closed state in which the two surfaces are in contact with each other (e.g., the laptop or foldable device is shut closed). In this case, the in-bag detection logic 38 determines the device 10 is in the in-bag state in a case where the following equation is met:

(Lid Closed State=True) AND ((Steady State=True AND Non-Flat State=True) OR (Walking State=True AND Non-Handheld State=True) OR (Transport State=True))

As will be discussed in further detail below, the in-bag state determined by the in-bag detection logic 38 is output to, for example, an operating system layer of the device 10, and is used to adjust a power state of the device 10.

The out-from-bag detector 30 is communicatively coupled to the motion sensor 12 and the electrostatic charge sensor 14. The out-from-bag detector 30 receives motion measurements from the motion sensor 12 and electrostatic charge measurements from the electrostatic charge sensor 14, and detects whether or not the device 10 is being taken out of a bag based on the motion measurements and the electrostatic charge measurements. In contrast to the in-bag detector 28, which detects the in-bag state, the out-from-bag detector 30 detects an out-from-bag event in which the device 10 is currently being taken out of a bag. As noted above, the bag may be a briefcase, backpack, should bag, or any other type of container that holds the device 10. The out-from-bag detector 30 includes an orientation change detector 48 and a false out-from-bag detector 50.

The orientation change detector 48 detects whether an orientation of the device 10 has changed. The orientation change detector 48 outputs an out-from-bag event to the false out-from-bag detector 50 in response to detecting an orientation change of the device 10. After detecting an out-from-bag event, the device 10 is estimated to be outside of a bag.

Figure 6:
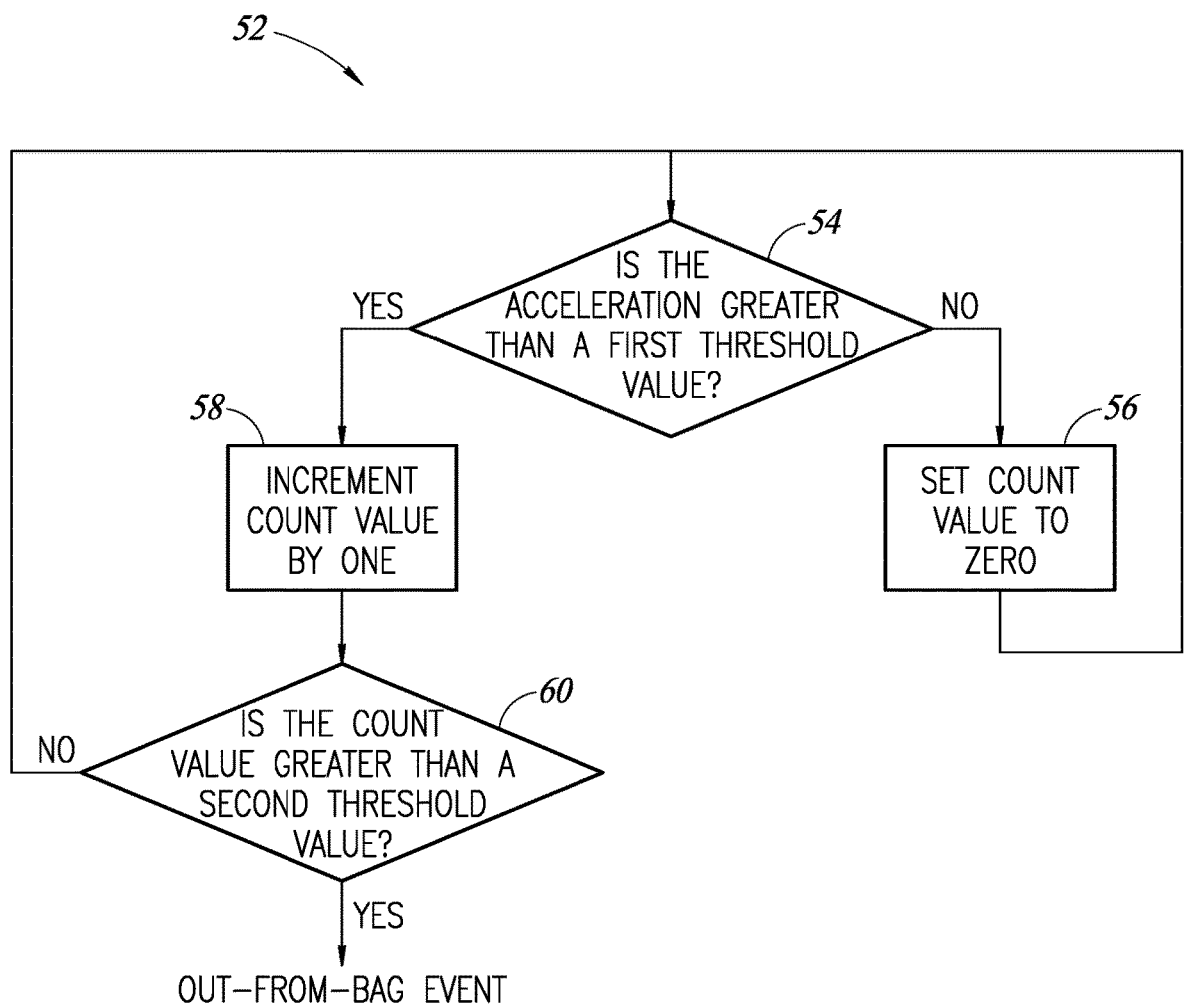
FIG. 6 is a flow diagram of a method of detecting whether an orientation of a device has changed according to an embodiment disclosed herein.

The orientation change detector 48 determines an orientation of the device 10 based on the motion measurements received from the motion sensor 12. In one embodiment, the motion sensor 12 is an accelerometer, and the orientation change detector 48 detects if the orientation of the device 10 has changed when an acceleration of the device 10 along at least one axis is greater than a threshold value for a threshold duration of time. FIG. 6 is a flow diagram of a method 52 of detecting whether an orientation of the device 10 has changed according to an embodiment disclosed herein.

In block 54, the orientation change detector 48 determines whether or not an acceleration of the device 10 along the axis parallel to gravity is greater than or equal to a first threshold value. In one embodiment, the first threshold value is between 800 and 900 mg. If the acceleration of the device 10 along the axis parallel to gravity is not greater than or equal to the first threshold value (i.e., is less than the first threshold value), the method 52 moves to block 56. If the acceleration of the device 10 along the axis parallel to gravity is greater than or equal to the first threshold value, the method moves to block 58.

In block 56, a count value is set to zero. The count value is a total number of consecutive times the acceleration of the device 10 along the axis parallel to gravity is determined to be greater than or equal to the first threshold value. The method 52 returns to block 54 for further processing.

In block 58, the count value is incremented by one. The method 52 then moves to block 60.

In block 60, the orientation change detector 48 determines whether or not the count value is greater than or equal to a second threshold value. In one embodiment, the second threshold value is between 25 and 30. If the count value is not greater than or equal to the second threshold value (i.e., is less than the second threshold value), the method returns to block 54 for further processing. If the count value is greater than or equal to the second threshold value, the orientation change detector 48 determines that an orientation of the device 10 has changed, and outputs the out-from-bag event to the false out-from-bag detector 50.

Returning to FIG. 3, the false out-from-bag detector 50 is used to determine whether or not the out-from-bag event detected by the orientation change detector 48 is a false detection. The false out-from-bag detector 50 determines whether or not the out-from-bag event detected by the orientation change detector 48 is a false detection by detecting the out-from-bag event again using electrostatic charge measurements. If the false out-from-bag detector 50 detects the out-from-bag event again, the false out-from-bag detector 50 validates the out-from-bag event detected by the orientation change detector 48 as a true detection and outputs the out-from-bag event. If the false out-from-bag detector 50 does not detect the out-from-bag event again, the false out-from-bag detector 50 invalidates the out-from-bag event detected by the orientation change detector 48 (i.e., determines the out-from-bag event detected by the orientation change detector 48 is a false detection) and does not output the out-from-bag event.

The false out-from-bag detector 50 validates the out-from-bag event detected by the orientation change detector 48 based on the electrostatic charge measurements from the electrostatic charge sensor 14. In an actual out-from-bag event, there is a brief time period in which the device 10 is moving in the air. During this time period, the electrostatic charge of the device 10 begins discharging. Conversely, during a false out-from-bag event, the electrostatic charge of the device 10 does not discharge. For example, FIG. 7A is an electrostatic charge measurement signal 62 in a case where the device 10 is being taken out of a bag, and FIG. 7B is an electrostatic charge measurement signal 64 in a case where the device 10 is not taken out of a bag (i.e., the device 10 remains in a bag during the orientation change).

Figure 7A:
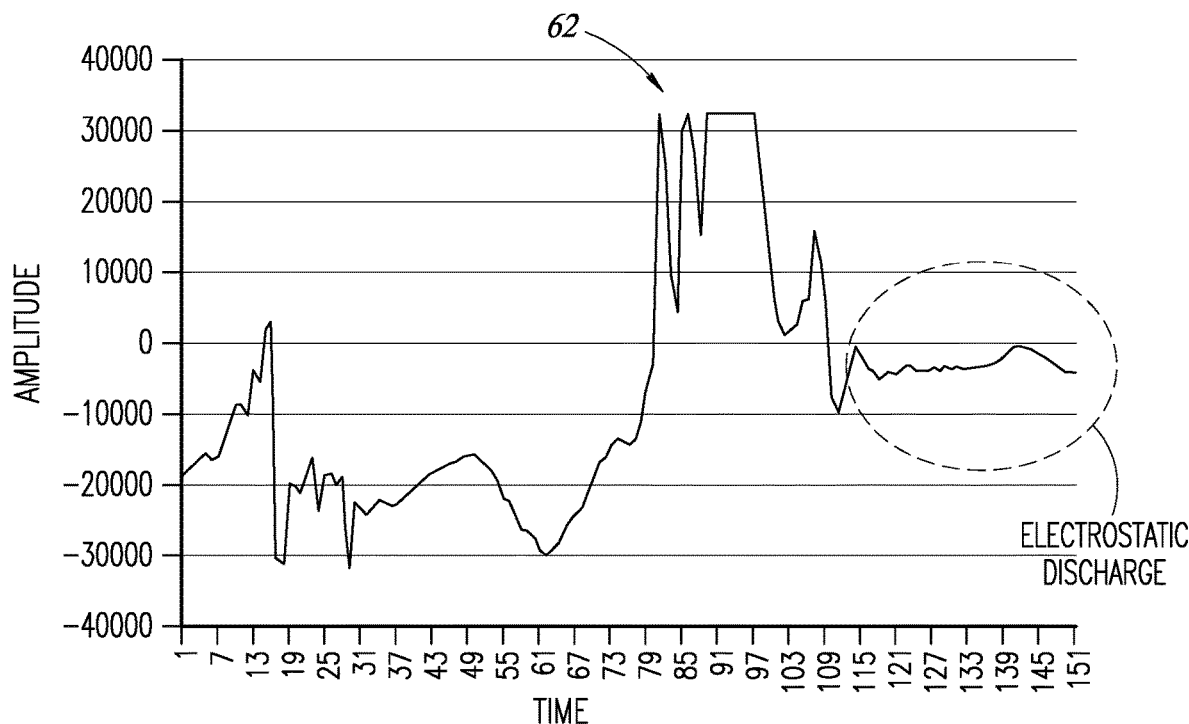
FIG. 7A is an electrostatic charge measurement signal in a case where a device is being taken out of a bag according to an embodiment disclosed herein.
Figure 7B:
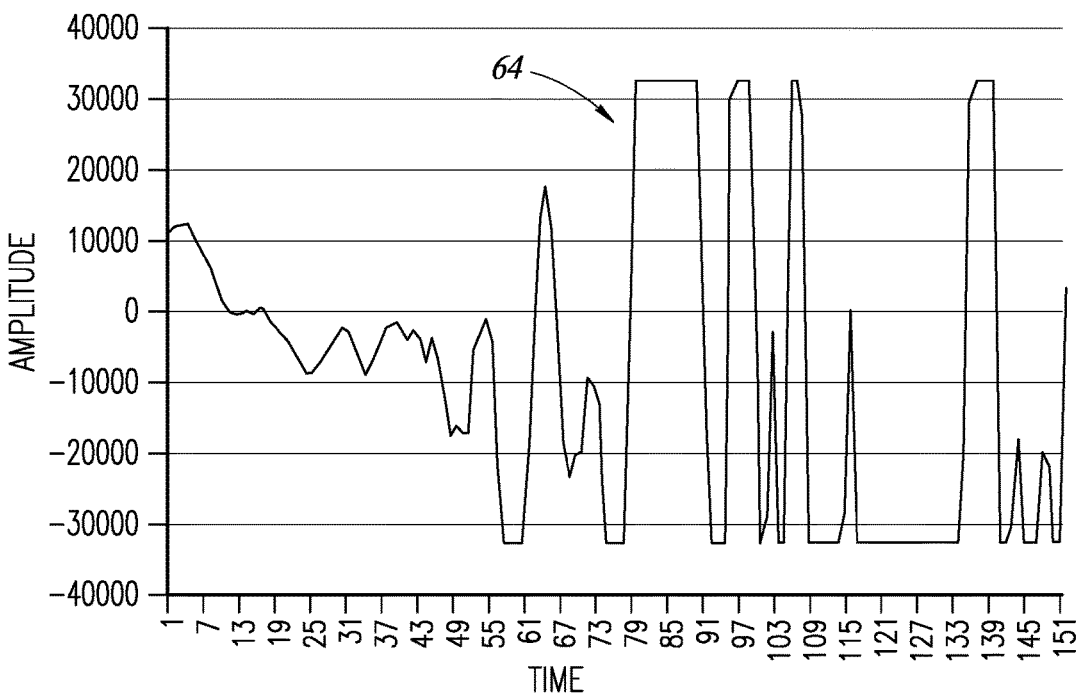
FIG. 7B is an electrostatic charge measurement signal in a case where a device is not taken out of a bag according to an embodiment disclosed herein.

In FIGS. 7A and 7B, the vertical axes are amplitudes of the electrostatic charge measurement signals, and the horizontal axes are time axes. The amplitudes are outputs from an ADC with a full scale value (i.e., absolute maximum value) of 32,000, and the time axes are samples of the electrostatic charge measurements signals taken at 60 hertz for 2.5 seconds. Other amplitude and time units are also possible.

Referring to FIG. 7A, the encircled area is the time period in which the device 10 is taken out of the bag. As can be seen, the electrostatic charge measurement signal 62 discharges (i.e., the amplitude the electrostatic charge measurement signal 62 is near zero) in the encircled area. In contrast, in FIG. 7B, the electrostatic charge measurement signal 64 does not discharge as the device 10 is not taken out of the bag.

Accordingly, the false out-from-bag detector 50 is able to determine whether or not the out-from-bag event detected by the orientation change detector 48 is a false detection by determining whether or not the electrostatic charge of the device 10 is discharged.

In one embodiment, the false out-from-bag detector 50 determines whether or not an electrostatic charge measurement signal generated by the electrostatic charge sensor 14 is less than or equal to a threshold value for a set period of time. In response to the false out-from-bag detector 50 determining the electrostatic charge measurement signal is less than or equal to the threshold value, the false out-from-bag detector 50 validates the out-from-bag event detected by the orientation change detector 48 as a true detection and outputs the out-from-bag event. Conversely, in response to the false out-from-bag detector 50 determining the electrostatic charge measurement signal is not less than or equal to the threshold value (i.e., greater than the threshold value), the false out-from-bag detector 50 invalidates the out-from-bag event detected by the orientation change detector 48 (i.e., determines the out-from-bag event detected by the orientation change detector 48 is a false detection) and does not output the out-from-bag event.

The in-bag state determined by the in-bag detection logic 38 and the out-from-bag event validated by the false out-from-bag detector 50 are output to, for example, an operating system layer of the device 10. The operating system layer includes an operating system of the device 10 that, for example, controls and coordinates the hardware components of the device 10 and any peripheral devices communicatively coupled to the device 10.

The operating system layer adjusts a power state of the device 10 based on the in-bag state and the out-from-bag event. The power state of the device 10 may include any type of low, normal, or high power state now known or later developed. In one embodiment, the device 10 includes one or more of the following power states: a working state, a low power/standby state, a sleep state, a hibernate state, a soft off state, and a mechanical off state. In the working state, the device 10 is fully powered and ready to be used by a user. In the low power/standby state, the device 10 consumes less power than the working power state and is able to quickly switch to the working state. In the sleep state, the device 10 appears to be in an off state and consumes less power than the low power/standby state. In the hibernate state, the device 10 appears to be in an off state and consumes less power than the sleep state. In the soft off state, the device 10 appears to be in an off state and includes a full shutdown and reboot cycle. In the mechanical off state, the device 10 is in an off state and consumes no power.

In one embodiment, in a case where the device 10 is in the in-bag state and does not experience an out-from-bag event, the operating system layer sets the device 10 to a lower power state (e.g., the low power/standby state, the sleep state, the hibernate state, the soft off state, etc.).

In one embodiment, in a case where the device 10 experiences an out-from-bag event, the operating system layer switches the device 10 to a higher power state (e.g., from the hibernate state to the sleep state, from the sleep state to the working state, etc.).

In the embodiment discussed above, the operating system layer adjusts the power state of the device 10. However, other components of the device 10 may also be used to adjust the power state. For example, in one embodiment, the sensor controller 16, itself, adjusts the power state of the device 10 based on the in-bag state and the out-from-bag event.

Figure 8:
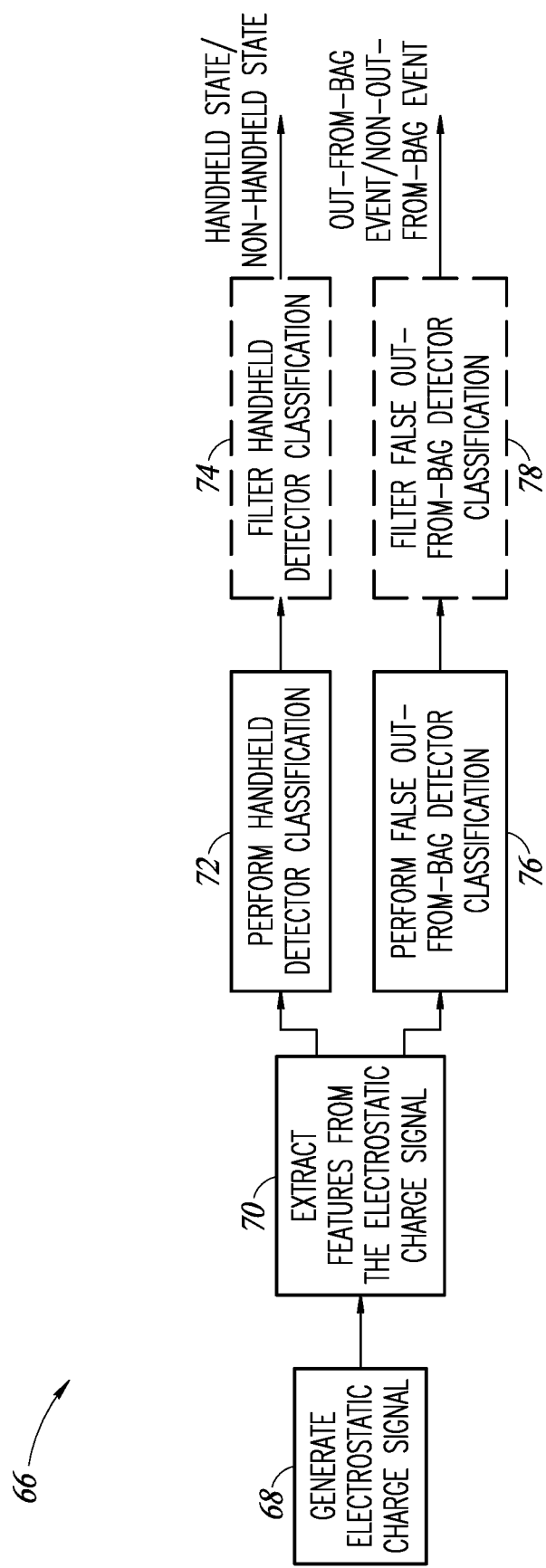
FIG. 8 is a flow diagram of a method for a handheld detector and a false out-from-bag detector according to an embodiment disclosed herein.

In one embodiment, both the handheld detector 36 and the false out-from-bag detector 50 utilize a machine learning approach to perform detection. Namely, the handheld detector 36 uses a machine learning approach to classify electrostatic charge measurements as the handheld state or the non-handheld state, and the false out-from-bag detector 50 uses a machine learning approach to classify electrostatic charge measurements as the out-from-bag event or a non-out-from-bag event. FIG. 8 is a flow diagram of a method 66 for the handheld detector 36 and the false out-from-bag detector 50 according to an embodiment disclosed herein.

In block 68, the electrostatic charge sensor 14 measures electrostatic charges of the device 10, and generates an electrostatic charge measurement signal that indicates the measured electrostatic charges. In one embodiment, the device 10 includes a buffer to store a plurality of electrostatic charge measurements, and generates an electrostatic charge measurement signal using the plurality of electrostatic charge measurements when the buffer is full.

In block 70, the sensor controller 16 receives the electrostatic charge measurement signal from the electrostatic charge sensor 14, and extracts features from the electrostatic charge measurement signal.

The extracted features characterize the amplitude and the instability of the electrostatic charge measurement signal. For example, the sensor controller 16 determines at least one of the following calculations to characterize the electrostatic charge measurement signal: an energy calculation (e.g., a total energy of the electrostatic charge measurement signal in a period of time), a variance calculation (e.g., a variance of the electrostatic charge measurement signal in a period of time), a zero crossing calculation (e.g., a number of times the electrostatic charge measurement signal crosses zero in a period of time), a peak-to-peak calculation (e.g., a difference between the maximum amplitude and the minimum amplitude of the electrostatic charge measurement signal in a period of time), a peak count calculation (e.g., a total number of peaks in the electrostatic charge measurement signal in a period of time), an absolute mean calculation (e.g., an absolute mean of the electrostatic charge measurement signal in a period of time), a maximum calculation (e.g., a maximum of the electrostatic charge measurement signal in a period of time), or a minimum calculation (e.g., a minimum of the electrostatic charge measurement signal in a period of time). Other types of calculations are also possible.

In one embodiment, the features are extracted within a time window of the electrostatic charge measurement signal. For example, the features may be calculated within a 2.5 second time window. The time window is, for example, defined based on a minimum number of electrostatic measurements to ensure proper detection by the handheld detector 36 and the false out-from-bag detector 50.

In block 72, the handheld detector 36 classifies the electrostatic charge measurement signal as either the handheld state or the non-handheld state based on the features extracted in block 70.

The handheld detector 36 uses a machine learning approach to classify the electrostatic charge measurement signal as either the handheld state or the non-handheld state. For example, the handheld detector 36 uses one of a decision tree, a neural network, or a support vector machine to classify the electrostatic charge measurement signal. Other machine learning techniques are also possible.

In one embodiment, the decision tree in the following table is used to determine the handheld state and the non-handheld state.

| Condition | State |
|---|---|
| Energy ≤ First Energy Threshold Value AND Variance Calculation ≤ Variance Threshold Value | Handheld |
| Energy ≤ First Energy Threshold Value AND Variance > Variance Threshold Value AND Peak Count > First Peak Count Threshold Value | Non-Handheld |
| Energy ≤ First Energy Threshold Value AND Variance > Variance Threshold Value AND Peak Count ≤ First Peak Count Threshold Value AND Zero Crossing > Zero Crossing Threshold Value | Handheld |
| Energy ≤ First Energy Threshold Value AND Variance > Variance Threshold Value AND Peak Count ≤ First Peak Count Threshold Value AND Zero Crossing ≤ Zero Crossing Threshold Value AND Peak Count > Second Peak Count Threshold Value | Non-Handheld |
| Energy ≤ First Energy Threshold Value AND Variance > Variance Threshold Value AND Peak Count ≤ First Peak Count Threshold Value AND Zero Crossing ≤ Zero Crossing Threshold Value AND Peak Count ≤ Second Peak Count Threshold Value | Handheld |
| Energy > First Energy Threshold Value AND Energy > Second Energy Threshold Value | Non-Handheld |
| Energy > First Energy Threshold Value AND Energy ≤ Second Energy Threshold Value AND Peak-To-Peak > Peak-To-Peak Threshold Value | Handheld |
| Energy > First Energy Threshold Value AND Energy ≤ Second Energy Threshold Value AND Peak-To-Peak ≤ Peak-To-Peak Threshold Value | Non-Handheld |

In the decision tree above, the first peak count threshold value is greater than the second peak count threshold value, and the first energy threshold value is less than the second energy threshold value.

Utilizing electrostatic charge sensor measurements to perform handheld detection, greatly improves the efficiency and processing time of the handheld detector 36, and, thus, the in-bag detector 28. For example, current handheld detection methods, which generally utilize motion measurements, calculate more than three times the features calculated by the handheld detector 36, and execute decision trees that are more than twice the size as the decision tree executed by the handheld detector 36. As a result, current consumption and memory of the in-bag detector 28 is reduced compared to current in-bag detection methods.

In block 74, the handheld detector 36 uses a meta-classifier to filter classifications of the electrostatic charge measurement signal in block 72. The handheld detector 36 filters classifications of the electrostatic charge measurement signal to remove or reduce false positives.

In one embodiment, the handheld detector 36 reduces false detections of the handheld state by maintaining a first count value. The first count value is a total number of times the handheld detector 36 classified the electrostatic charge measurement signal as the handheld state. When the total number is equal to or greater than a first threshold count value, the handheld detector 36 determines that the electrostatic charge measurement signal is the handheld state.

Similarly, in one embodiment, the handheld detector 36 reduces false detections of the non-handheld state by maintaining a second count value. The second count value is a total number of times the handheld detector 36 classified the electrostatic charge measurement signal as the non-handheld state. When the total number is equal to or greater than a second threshold count value, the handheld detector 36 determines that the electrostatic charge measurement signal is the non-handheld state.

It is noted that block 74 may be removed (i.e., not performed) from the method 66 to reduce latency of the handheld detector classification block 72.

Subsequent to block 74, the handheld detector 36 outputs the detection results to the in-bag detection logic 38 for further processing as explained above with respect to FIG. 3.

In block 76, the false out-from-bag detector 50 classifies the electrostatic charge measurement signal as the out-from-bag event based on the features extracted in block 70.

Similar to the handheld detector 36, the false out-from-bag detector 50 uses a machine learning approach to classify the electrostatic charge measurement signal as the out-from-bag event. For example, the false out-from-bag detector 50 uses one of a decision tree, a neural network, or a support vector machine to classify the electrostatic charge measurement signal. Other machine learning techniques are also possible.

In one embodiment, the decision tree in the following table is used to determine the out-from-bag event or a non-out-from-bag event.

| Condition | Event |
|---|---|
| Peak-To-Peak ≤ Peak-To-Peak Threshold Value AND Peak Count ≤ First Peak Count Threshold Value AND Zero Crossing ≤ First Zero Crossing Threshold Value AND Variance Calculation ≤ Variance Threshold Value AND Zero Crossing ≤ Second Zero Crossing Threshold Value | Out-From-Bag |
| Peak-To-Peak ≤ Peak-To-Peak Threshold Value AND Peak Count ≤ First Peak Count Threshold Value AND Zero Crossing ≤ First Zero Crossing Threshold Value AND Variance Calculation ≤ Variance Threshold Value AND Zero Crossing > Second Zero Crossing Threshold Value AND Peak Count ≤ Second Peak Count Threshold Value | Out-From-Bag |
| Peak-To-Peak ≤ Peak-To-Peak Threshold Value AND Peak Count ≤ First Peak Count Threshold Value AND Zero Crossing ≤ First Zero Crossing Threshold Value AND Variance Calculation ≤ Variance Threshold Value AND Zero Crossing > Second Zero Crossing Threshold Value AND Peak Count > Second Peak Count Threshold Value | Non-Out-From-Bag |
| Peak-To-Peak ≤ Peak-To-Peak Threshold Value AND Peak Count ≤ First Peak Count Threshold Value AND Zero Crossing ≤ First Zero Crossing Threshold Value AND Variance Calculation > Variance Threshold Value | Non-Out-From-Bag |
| Peak-To-Peak ≤ Peak-To-Peak Threshold Value AND Peak Count ≤ First Peak Count Threshold Value AND | Non-Out-From-Bag |

-continued

| Condition | Event |
|---|---|
| Zero Crossing > First Zero Crossing Threshold Value AND<br>Absolute Mean ≤ First Absolute Mean Threshold Value AND<br>Peak Count ≤ Third Peak Count Threshold Value | |
| Peak-To-Peak ≤ Peak-To-Peak Threshold Value AND<br>Peak Count ≤ First Peak Count Threshold Value AND<br>Zero Crossing > First Zero Crossing Threshold Value AND<br>Absolute Mean ≤ First Absolute Mean Threshold Value AND<br>Peak Count > Third Peak Count Threshold Value AND<br>Energy ≤ Energy Threshold Value | Non-Out-From-Bag |
| Peak-To-Peak ≤ Peak-To-Peak Threshold Value AND<br>Peak Count ≤ First Peak Count Threshold Value AND<br>Zero Crossing > First Zero Crossing Threshold Value AND<br>Absolute Mean ≤ First Absolute Mean Threshold Value AND<br>Peak Count > Third Peak Count Threshold Value AND<br>Energy > Energy Threshold Value AND<br>Zero Crossing ≤ Third Zero Crossing Threshold Value AND<br>Maximum ≤ First Maximum Threshold Value AND<br>Maximum ≤ Second Maximum Threshold Value AND<br>Maximum ≤ Third Maximum Threshold Value AND<br>Peak Count ≤ Fourth Peak Count Threshold Value | Non-Out-From-Bag |
| Peak-To-Peak ≤ Peak-To-Peak Threshold Value AND<br>Peak Count ≤ First Peak Count Threshold Value AND<br>Zero Crossing > First Zero Crossing Threshold Value AND<br>Absolute Mean ≤ First Absolute Mean Threshold Value AND<br>Peak Count > Third Peak Count Threshold Value AND<br>Energy > Energy Threshold Value AND<br>Zero Crossing ≤ Second Zero Crossing Threshold Value AND<br>Maximum ≤ First Maximum Threshold Value AND<br>Maximum ≤ Second Maximum Threshold Value AND<br>Maximum ≤ Third Maximum Threshold Value AND<br>Peak Count > Fourth Peak Count Threshold Value | Out-From-Bag |
| Peak-To-Peak ≤ Peak-To-Peak Threshold Value AND<br>Peak Count ≤ First Peak Count Threshold Value AND<br>Zero Crossing > First Zero Crossing Threshold Value AND<br>Absolute Mean ≤ First Absolute Mean Threshold Value AND<br>Peak Count > Third Peak Count Threshold Value AND<br>Energy > Energy Threshold Value AND<br>Zero Crossing ≤ Second Zero Crossing Threshold Value AND<br>Maximum ≤ First Maximum Threshold Value AND<br>Maximum ≤ Second Maximum Threshold Value AND<br>Maximum > Third Maximum Threshold Value | Non-Out-From-Bag |
| Peak-To-Peak ≤ Peak-To-Peak Threshold Value AND<br>Peak Count ≤ First Peak Count Threshold Value AND<br>Zero Crossing > First Zero Crossing Threshold Value AND<br>Absolute Mean ≤ First Absolute Mean Threshold Value AND<br>Peak Count > Third Peak Count Threshold Value AND<br>Energy > Energy Threshold Value AND<br>Zero Crossing ≤ Second Zero Crossing Threshold Value AND<br>Maximum ≤ First Maximum Threshold Value AND<br>Maximum > Second Maximum Threshold Value | Out-From-Bag |
| Peak-To-Peak ≤ Peak-To-Peak Threshold Value AND<br>Peak Count ≤ First Peak Count Threshold Value AND<br>Zero Crossing > First Zero Crossing Threshold Value AND<br>Absolute Mean ≤ First Absolute Mean Threshold Value AND<br>Peak Count > Third Peak Count Threshold Value AND<br>Energy > Energy Threshold Value AND<br>Zero Crossing ≤ Second Zero Crossing Threshold Value AND<br>Maximum > First Maximum Threshold Value | Non-Out-From-Bag |
| Peak-To-Peak ≤ Peak-To-Peak Threshold Value AND<br>Peak Count ≤ First Peak Count Threshold Value AND<br>Zero Crossing > First Zero Crossing Threshold Value AND<br>Absolute Mean ≤ First Absolute Mean Threshold Value AND<br>Peak Count > Third Peak Count Threshold Value AND<br>Energy > Energy Threshold Value AND<br>Zero Crossing > Third Zero Crossing Threshold Value | Non-Out-From-Bag |
| Peak-To-Peak ≤ Peak-To-Peak Threshold Value AND<br>Peak Count ≤ First Peak Count Threshold Value AND<br>Zero Crossing > First Zero Crossing Threshold Value AND<br>Absolute Mean > First Absolute Mean Threshold Value | Out-From-Bag |
| Peak-To-Peak ≤ Peak-To-Peak Threshold Value AND<br>Peak Count > First Peak Count Threshold Value | Out-From-Bag |
| Peak-To-Peak > Peak-To-Peak Threshold Value AND<br>Absolute Mean ≤ Second Absolute Mean Threshold Value AND<br>Peak Count ≤ Fifth Peak Count Threshold Value | Non-Out-From-Bag |
| Peak-To-Peak > Peak-To-Peak Threshold Value AND<br>Absolute Mean ≤ Second Absolute Mean Threshold Value AND<br>Peak Count > Fifth Peak Count Threshold Value | Out-From-Bag |

-continued

| Condition | Event |
|---|---|
| Peak-To-Peak > Peak-To-Peak Threshold Value AND Absolute Mean > Second Absolute Mean Threshold Value | Out-From-Bag |

In the decision tree above, the first peak count threshold value is greater than the second peak count threshold value, the first peak count threshold value is greater than the third peak count threshold value, the third peak count threshold value is less than the fourth peak count threshold value, the first zero crossing threshold value is greater than the second zero crossing threshold value, the first zero crossing threshold value is less than the third zero crossing threshold value, the first maximum threshold value is greater than the second maximum threshold value, and the second maximum threshold value is greater than the third maximum threshold value.

In block 78, the false out-from-bag detector 50 uses a meta-classifier to filter classifications of the electrostatic charge measurement signal in block 76. The false out-from-bag detector 50 filters classifications of the electrostatic charge measurement signal to remove or reduce false positives.

In one embodiment, the false out-from-bag detector 50 reduces false detections of the out-from-bag event by maintaining a first count value. The first count value is a total number of times the false out-from-bag detector 50 classified the electrostatic charge measurement signal as the out-from-bag event. When the total number is equal to or greater than a first threshold count value, the false out-from-bag detector 50 determines that the electrostatic charge measurement signal is the out-from-bag event.

Similarly, in one embodiment, the false out-from-bag detector 50 reduces false detections of the non-out-from-bag event by maintaining a second count value. The second count value is a total number of times the false out-from-bag detector 50 classified the electrostatic charge measurement signal as the non-out-from-bag event. When the total number is equal to or greater than a second threshold count value, the false out-from-bag detector 50 determines that the electrostatic charge measurement signal is the non-out-from-bag event.

It is noted that block 78 may be removed from the method 66 (i.e., not performed) to reduce latency of the false out-from-bag detector classification block 76.

Subsequent to block 78, the false out-from-bag detector 50 outputs the detection results to the in-bag detection logic 38 for further processing as explained above with respect to FIG. 3.

It is noted that the handheld detector classification in block 72 and the false out-from-bag detector classification in block 76 are both performed using the features extracted in block 70. Stated differently, the same features may be used for handheld detector classification and false out-from-bag detector classification. As a result, the sensor controller 16 is able to extract a single set of features for handheld detector classification and false out-from-bag detector classification, and reduce computational costs.

Figure 9:
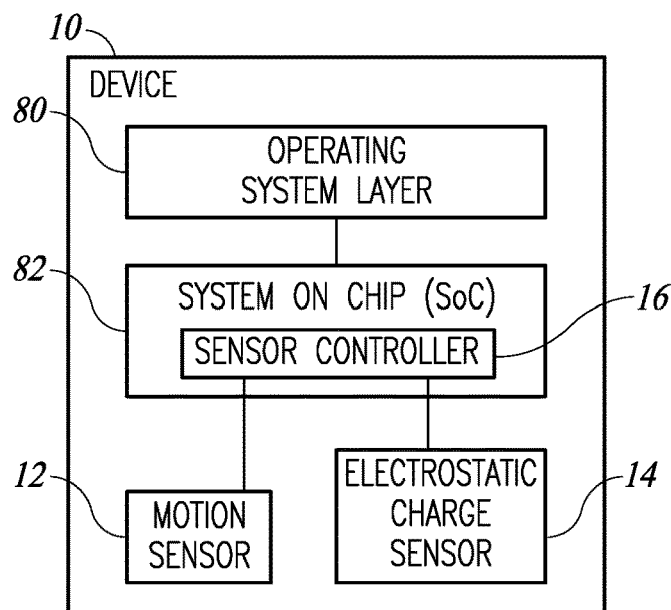
FIG. 9 is a block diagram of a device according to an embodiment disclosed herein.
Figure 10:
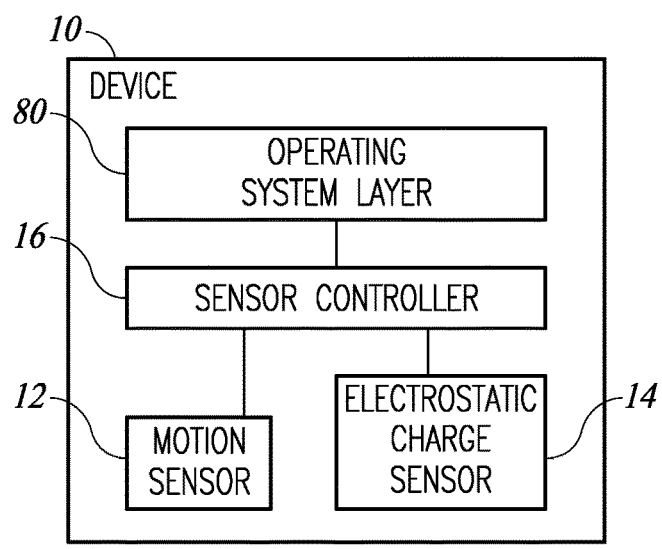
FIG. 10 is a block diagram of a device according to an embodiment disclosed herein.
Figure 11:
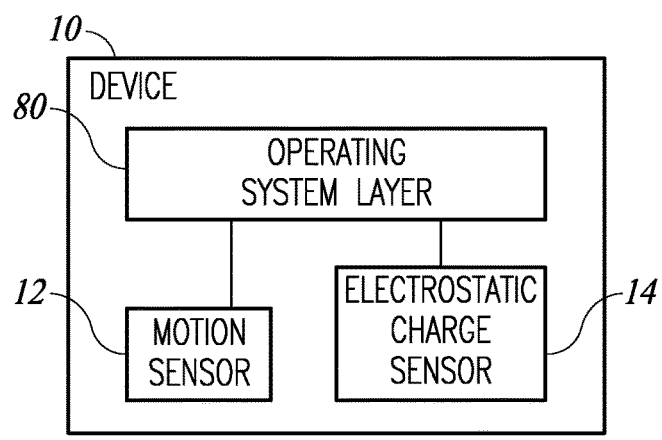
FIG. 11 is a block diagram of a device according to an embodiment disclosed herein.

The program or algorithm to perform the in-bag state detection and the out-from-bag event detection discussed above may be implemented in several different locations within the device 10. FIGS. 9 to 11 illustrate different implementations of the device 10.

FIG. 9 is a block diagram of the device 10 according to an embodiment disclosed herein. The device 10 includes an operating system layer 80, a system on chip (SOC) 82, the motion sensor 12, the electrostatic charge sensor 14, and the sensor controller 16.

As discussed above, the operating system layer 80 includes an operating system of the device 10 that, for example, controls and coordinates the hardware components of the device 10 and any peripheral devices communicatively coupled to the device 10. The SOC 82 is communicatively coupled to the operating system layer 80. The SOC 82 is, for example, an integrated circuit that includes the hardware components of the device 10, such as a processing unit, memory, input/output ports, etc. The motion sensor 12 and the electrostatic charge sensor 14 are communicatively coupled to the sensor controller 16. As discussed above, the motion sensor 12 and the electrostatic charge sensor 14 transmit motion measurements and electrostatic charge measurements, respectively, to the sensor controller 16. The sensor controller 16 is included in the SOC 82. As discussed above, the sensor controller 16 receives motion measurements from the motion sensor 12 and electrostatic charge measurements from the electrostatic charge sensor 14, and determines whether the device 10 is in the in-bag state or the out-from-bag event occurred based on the motion measurements and electrostatic charge measurements.

FIG. 10 is a block diagram of the device 10 according to an embodiment disclosed herein. Similar to the embodiment shown in FIG. 9, the device 10 includes the operating system layer 80, the motion sensor 12, the electrostatic charge sensor 14, and the sensor controller 16. However, in contrast to the embodiment shown in FIG. 9, the device 10 does not include the SOC 82. Rather, the sensor controller 16 is communicatively coupled directly with the operating system layer 80, without the SOC 82 being an intervening connection.

FIG. 11 is a block diagram of the device 10 according to an embodiment disclosed herein. Similar to the embodiment shown in FIG. 10, the device 10 includes the operating system layer 80, the motion sensor 12, and the electrostatic charge sensor 14. However, in contrast to the embodiment shown in FIG. 10, the device 10 does not include the SOC 82 and the sensor controller 16. Instead, the motion sensor 12 and the electrostatic charge sensor 14 are communicatively coupled to the operating system layer 80. In this embodiment, the motion sensor 12 and the electrostatic charge sensor 14, themselves, are capable of performing processing operations, and the operations of the sensor controller 16 are implemented directly in hardware of the motion sensor 12 and the electrostatic charge sensor 14. For example, the motion sensor 12 and the electrostatic charge sensor 14 are included in a single combination sensor with processing capabilities. The single combination sensor performs the functions of the sensor controller 16 as discussed above.

The various embodiments shown in FIGS. 9 to 11 have different current consumptions. The current consumption of the embodiment shown in FIG. 9 is greater than the current consumption of the embodiment shown in FIG. 10, and the current consumption of the embodiment shown in FIG. 10 is greater than the current consumption of the embodiment shown in FIG. 11. A manufacturer may adjust the implementation of the in-bag and out-from-bag detections disclosed herein to meet various power requirements of the device 10.

The various embodiments disclosed herein provide a device that detects whether the device is in a bag or is being taken out of the bag. The device determines whether the device is in a bag or being taken out of the bag based on motion measurements generated by at least one motion sensor and electrostatic charge measurements generated by at least one electrostatic charge sensor. The device subsequently adjusts a power state of the device based on whether the device is in the bag or being taken out of the bag. Using electrostatic charge measurements reduces current consumption and memory of in-bag detection and reduces false detections of out-from-bag event, compared to current in-bag and out-from-bag detection methods. As a result, the device disclosed herein is able to detect whether the device is in the bag or is being taken out of the bag with high efficiency, accuracy, and robustness.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A device, comprising:
   a motion sensor configured to generate a motion measurement signal of the device;
   an electrostatic charge sensor configured to generate an electrostatic charge measurement signal of the device; and
   a controller configured to:
      determine an activity state of the device based on the motion measurement signal;
      determine a flat state of the device based on the motion measurement signal;
      determine a handheld state of the device based on the electrostatic charge measurement signal;
      determine an in-bag state of the device based on the activity state, the flat state, and the handheld state, the in-bag state indicating the device is in a bag;
      determine an orientation change of the device based on the motion measurement signal;
      determine a false detection of the orientation change based on the electrostatic charge measurement signal;
      determine an out-from-bag event of the device based on the orientation change, the motion measurement signal, and the electrostatic charge measurement signal, the out-from-bag event indicating the device is being taken out of the bag; and
      adjust a power state of the device based on the in-bag state or the out-from-bag event.

2. The device of claim 1 wherein the activity state indicates whether the device is stationary or in transport, the flat state indicates the device is positioned on a flat surface, and the handheld state indicates the device is held in a user's hand.

3. The device of claim 1 wherein the controller is configured to:
   determine at least one characteristic of the electrostatic charge measurement signal; and
   determine the handheld state of the device based on the at least one characteristic.

4. The device of claim 3 wherein the at least one characteristic includes at least one of an energy calculation, a variance calculation, a zero crossing calculation, a peak-to-peak calculation, a peak count calculation, an absolute mean calculation, a maximum calculation, or a minimum calculation.

5. The device of claim 1 wherein the electrostatic charge sensor includes at least one electrode.

6. The device of claim 5, further comprising:
   a first surface; and
   a second surface, the electrostatic charge sensor including a first electrode on the first surface and a second electrode on the second surface.

7. The device of claim 1 wherein the controller adjusts the power state of the device by instructing an operating system of the device to change the power state of the device.

8. The device of claim 1 wherein the handheld state is determined using one of a decision tree, a neural network, or a support vector machine.

9. The device of claim 1 wherein the controller is configured to:
   determine at least one characteristic of the electrostatic charge measurement signal; and
   determine the false detection of the orientation change based on the at least one characteristic.

10. The device of claim 9 wherein the at least one characteristic includes at least one of an energy calculation, a variance calculation, a zero crossing calculation, a peak-to-peak calculation, a peak count calculation, an absolute mean calculation, a maximum calculation, or a minimum calculation.

11. A device, comprising:
    a motion sensor configured to generate a motion measurement;
    an electrostatic charge sensor configured to generate an electrostatic charge measurement, the electrostatic charge sensor including at least one electrode at a surface of the device; and
    a controller configured to:
       determine an activity state of the device based on the motion measurement;
       determine whether the device is in a flat state or non-flat state based on the motion measurement;
       determine whether the device is in a handheld state or a non-handheld state based on the electrostatic charge measurement; and
       output an in-bag state of the device based on the activity state, the flat state, and the handheld state, the in-bag state indicating the device is in a bag, the in-bag state being output in case:
          the determined activity state is a first state and the device is determined to be in the non-flat state; or
          the determined activity state is a second state different from the first state and the device is determined to be in the non-handheld state.

12. The device of claim 11 wherein the controller is configured to determine an out-from-bag event of the device based on the motion measurement and the electrostatic charge measurement, the out-from-bag event indicating the device is being taken out of the bag.

13. The device of claim 11 wherein the device includes a plurality of surfaces, the electrostatic charge sensor includes a plurality of electrodes, and each of the plurality of electrodes is at a respective surface of the plurality of surfaces.

14. The device of claim 11 wherein the controller is configured to adjust a power state of the device based on the in-bag state, and the power state includes at least one of a working state, a low power state, a sleep state, a hibernate state, a soft off state, or a mechanical off state.

15. The device of claim 11 wherein the activity state indicates whether the device is stationary or in transport, the flat state indicates the device is positioned on a flat surface, and the handheld state indicates the device is held in a user's hand.

16. The device of claim 11 wherein the first state is a steady state, and the second state is a walking state.

17. A device, comprising:
a motion sensor configured to generate a motion measurement signal of the device;
an electrostatic charge sensor configured to generate an electrostatic charge measurement signal of the device; and
a controller configured to:
determine an orientation change of the device based on the motion measurement signal;
determine an out-from-bag event of the device in response to the orientation change being determined, the out-from-bag event indicating the device is being taken out of the bag;
determine an electrostatic discharge based on the electrostatic charge measurement signal;
validate the out-from-bag event in response to the electrostatic discharge being determined; and
output the out-from-bag event in response to the out-from-bag event being validated.

18. The device of claim 17 wherein the controller is configured to:
determine at least one characteristic of the electrostatic charge measurement signal; and
determine a false detection of the orientation change based on the at least one characteristic.

19. The device of claim 18 wherein the at least one characteristic includes at least one of an energy calculation, a variance calculation, a zero crossing calculation, a peak-to-peak calculation, a peak count calculation, an absolute mean calculation, a maximum calculation, or a minimum calculation.

* * * * *